US012622144B2

(12) United States Patent
Shin et al.

(10) Patent No.:  US 12,622,144 B2
(45) Date of Patent:  May 5, 2026

(54) DISPLAY DEVICE

(71) Applicant: LG Display Co., Ltd., Seoul (KR)

(72) Inventors: Seung Hwan Shin, Paju-si (KR);
Byung Sam Min, Paju-si (KR); **In
Yeong Kong**, Paju-si (KR)

(73) Assignee: LG Display Co., Ltd., Seoul (KR)

( * ) Notice: Subject to any disclaimer, the term of this
patent is extended or adjusted under 35
U.S.C. 154(b) by 16 days.

(21) Appl. No.: 18/952,534

(22) Filed: Nov. 19, 2024

(65) Prior Publication Data

US 2025/0221209 A1     Jul. 3, 2025

(30) Foreign Application Priority Data

Dec. 28, 2023   (KR) ........................ 10-2023-0194619

(51) Int. Cl.
*H10K 59/131*      (2023.01)
*G09G 3/00*        (2006.01)
*G09G 3/3225*      (2016.01)
*H10K 59/12*       (2023.01)

(52) U.S. Cl.
CPC ........... *H10K 59/131* (2023.02); *G09G 3/006*
(2013.01); *G09G 3/3225* (2013.01); *H10K
59/1201* (2023.02); *G09G 2300/0426*
(2013.01); *G09G 2300/0452* (2013.01); *G09G
2320/0223* (2013.01)

(58) Field of Classification Search
CPC .. H10K 59/1201; H10K 59/131; G09G 3/006;
G09G 3/3225; G09G 3/3266
See application file for complete search history.

(56) References Cited

U.S. PATENT DOCUMENTS

| | | | | |
|---|---|---|---|---|
| 9,305,478 B2 * | 4/2016 | Park | .......................... | G09G 3/003 |
| 12,431,065 B2 * | 9/2025 | Qiu | .......................... | G09G 3/3266 |

* cited by examiner

*Primary Examiner* — Sardis F Azongha
(74) *Attorney, Agent, or Firm* — Seed Intellectual
Property Law Group LLP

(57)  ABSTRACT

Disclosed is a display device including a first pixel including
three subpixels respectively connected to first to third data
lines arranged in a first direction and connected to a first gate
line arranged in a second direction, a second pixel including
three subpixels respectively connected to the first to third
data lines and connected to a second gate line, a third pixel
including three subpixels respectively connected to the first
to third data lines and connected to a third gate line, and a
fourth pixel including three subpixels respectively con-
nected to the first to third data lines and connected to a fourth
gate line, wherein emission areas and circuit areas included
in the first pixel and the fourth pixel are inverted compared
to emission areas and circuit areas included in the second
pixel and the third pixel.

17 Claims, 17 Drawing Sheets

DISPLAY DEVICE

CROSS-REFERENCE TO RELATED APPLICATION(S)

This application claims the benefit of Korean Patent Application No. 10-2023-0194619, filed on Dec. 28, 2023, which is hereby incorporated by reference as if fully set forth herein.

BACKGROUND

Technical Field

The present disclosure relates to a display device.

Description of the Related Art

As information technology develops, the market for display devices, which are connection media between users and information, is growing. Accordingly, use of display devices, such as a light emitting display device (LED), a quantum dot display device (QDD), and a liquid crystal display device (LCD), is increasing.

The above-described display devices include a display panel including subpixels, drivers which output driving signals to drive the display panel, and a power supply which generates power to be supplied to the display panel or the driver.

In the above display devices, when the driving signals, such as scan and data signals, are supplied to the subpixels formed in the display panels, the selected subpixels transmit light or directly emit light, and thereby, the display devices display images.

BRIEF SUMMARY

Accordingly, the present disclosure is directed to a display device that substantially obviates one or more problems due to limitations and disadvantages of the related art.

An object of the present disclosure is to minimize an increase in RC delay of data lines while being capable of defining and changing the charging order of a data voltage to enable column inversion.

Another object of the present disclosure is to provide a structure which prevents twisting and short-circuit between wires, maximizes an opening ratio, minimizes the possibility of occurrence of short-circuit due to an increase in the number of connection lines (connection electrodes), and is easy to repair.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a first pixel including three subpixels respectively connected to a first data line, a second data line, and a third data line that are arranged in a first direction and connected to a first gate line arranged in a second direction, a second pixel including three subpixels respectively connected to the first data line, the second data line, and the third data line and connected to a second gate line spaced apart from the first gate line in the second direction, a third pixel including three subpixels respectively connected to the first data line, the second data line, and the third data line and connected to a third gate line spaced apart from the second gate line in the second direction, and a fourth pixel including three subpixels respectively connected to the first data line, the second data line, and the third data line and connected to a fourth gate line spaced apart from the third gate line in the second direction, wherein emission areas and circuit areas of the first pixel and the fourth pixel are inverted compared to emission areas and circuit areas of the second pixel and the third pixel.

By way of example, at least one of the first data line, the second data line, or the third gate line traverses the emission areas.

By way of example, each of the first data line, the second data line, and the third data line includes a plurality of data connection lines arranged in the second direction that provides electrical connection to the three subpixels included in each of the first pixel, the second pixel, and the third pixel, and the data connection lines traverse the emission areas.

By way of example, each of the first data line, the second data line, and the third data line includes two data lines spaced apart from each other, and a connection electrode that electrically connects the two data lines.

By way of example, the display device further includes a first reference line, a second reference line, and a third reference line arranged in the first direction and respectively connected to the first pixel, the second pixel, and the third pixel, wherein each of the first reference line, the second reference line, and the third reference line includes a plurality of reference connection lines arranged in the second direction that provides electrical connection to the first pixel, the second pixel, and the third pixel, and the reference connection lines traverse the emission areas.

By way of example, the first data line, the second data line, and the third data line are formed based on a lower metal layer located as a lowermost layer on a substrate, and the data connection lines are formed based on a semiconductor layer located above the lower metal layer.

By way of example, the first to third data lines are formed based on a lower metal layer located as a lowermost layer on a substrate, and the reference connection lines are formed based on a semiconductor layer located above the lower metal layer.

In another aspect of the present disclosure, a display device includes a display panel including a plurality of pixels, each of the pixels including a red subpixel, a green subpixel, and a blue subpixel, and a driver that, in operation, drives the display panel, wherein a plurality of red data connection lines and a plurality of blue data connection lines that respectively connect the red subpixels and the blue subpixels to a red data line and a blue data line completely symmetrical to each other horizontally and vertically, and a plurality of green data connection lines that connects the green subpixels to a green data line pseudosymmetrical horizontally and vertically with respect to the green data line.

By way of example, the display panel includes a plurality of gate lines respectively connected to the pixels, a plurality of data connection lines that connect the pixels to the red data line, the blue data line, and the green data line, and a plurality of reference connection lines that connect the pixels to a plurality of reference lines, and at least one of the gate lines, at least one of the data connection lines, and at least one of the reference connection lines traverse emission areas of the pixels.

By way of example, the pixels include a first pixel arranged adjacent to a first data line, a second pixel arranged adjacent to a second data line, and a third pixel arranged adjacent to a third data line, and the pixels are charged with a data voltage output from the driver in an order of the third pixel, the first pixel, and the second pixel.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

A display device according to the present disclosure may be implemented as a television, a video player, a personal computer (PC), a home theater, a vehicle electrical system, a smartphone, or the like, but is not limited thereto. The display device according to the present disclosure may be implemented as a light emitting display device (LED), a quantum dot display device (QDD), a liquid crystal display device (LCD), or the like. However, hereinafter, for convenience of explanation, a light emitting display device which directly emits light based on inorganic light emitting diodes or organic light emitting diodes will be described as an example.

Further, a transistor described below may be implemented as an n-type transistor, a p-type transistor, or a combination of n-type and p-type transistors. A transistor is a three-electrode device including a gate, a source, and a drain. The source is an electrode which supplies carriers to the transistor. In the transistor, carriers begin to flow from the source. The drain is an electrode through which carriers exit the transistor. That is, in the transistor, carriers flow from the source to the drain.

In the case of a p-type transistor, because carriers are holes, a source voltage is higher than a drain voltage so that the holes may flow from the source to the drain. In the p-type transistor, the holes flow from the source to the drain, and thus, current flows from the source to the drain. On the other hand, in the case of an n-type transistor, because carriers are electrons, a source voltage is lower than a drain voltage so that the electrons may flow from the source to the drain. In the n-type transistor, the electrons flow from the source to the drain, and thus, current flows from the drain to the source. However, the source and the drain of the transistor may be changed depending on applied voltage. Reflecting this, in the following description, one of the source and the drain will be described as a first electrode, and the remaining one of the source and the drain will be described as a second electrode.

Figure 1:
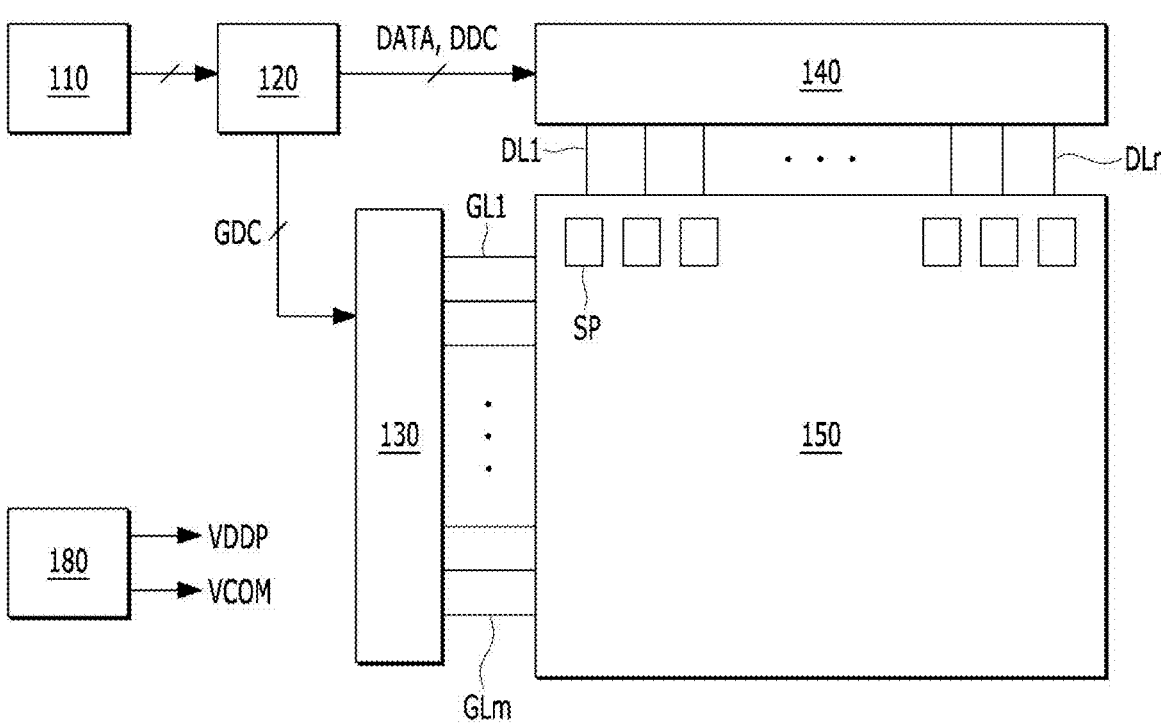
FIG. 1 is a block diagram schematically showing a light emitting display device.
Figure 2:
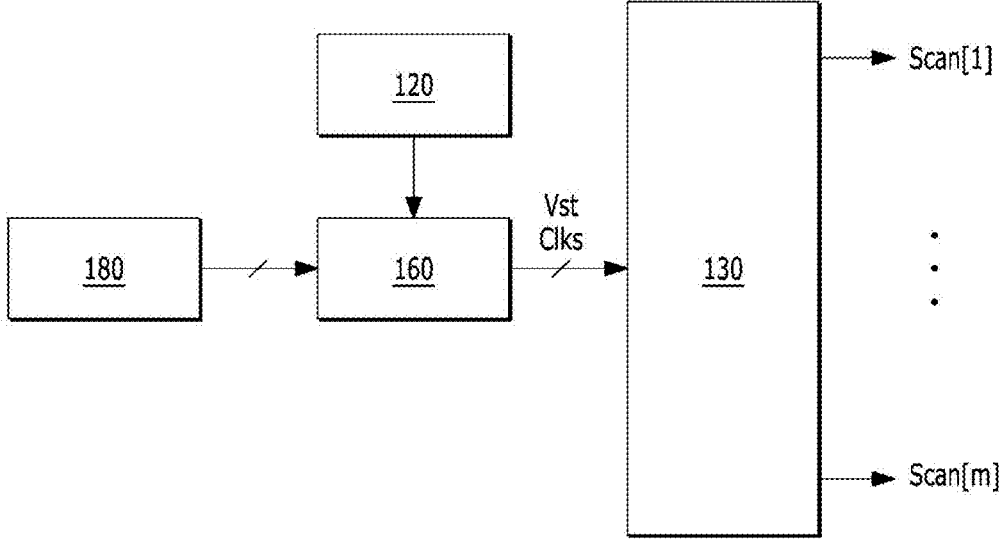
FIGS. 2 and 3 are diagrams for explaining the configuration of a gate-in-panel scan driver.
Figure 3:
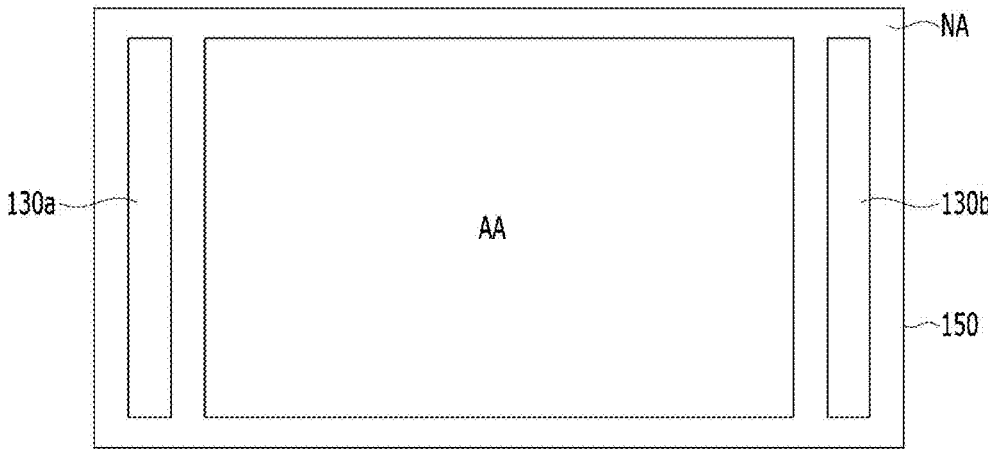

FIG. 1 is a block diagram schematically showing a light emitting display device, and FIGS. 2 and 3 are diagrams for explaining the configuration of a gate-in-panel scan driver.

As shown in FIGS. 1 to 3, by way of example, the light emitting display device includes an image supply unit 110, a timing controller 120, a scan driver 130, a data driver 140, a display panel 150, a power supply unit 180, and the like.

By way of example, the image supply unit (set or host system) 110 outputs various driving signals in addition to an image data signal supplied from the outside or an image data signal stored in an internal memory. The image supply unit 110 supplies a data signal DATA and various driving signals to the timing controller 120.

By way of example, the timing controller 120 outputs a gate timing control signal GDC for controlling operation timing of a scan driver 130, a data timing control signal DDC for controlling operation timing of the data driver 140, and various synchronization signals (a vertical synchronization signal Vsync and a horizontal synchronization signal Hsync). The timing controller 120 supplies the data signal DATA supplied from the image supply unit 110 together with the data timing control signal DDC to the data driver 140. The timing controller 120 is formed as an integrated circuit (IC) and mounted on a printed circuit board, but is not limited thereto.

By way of example, the scan driver 130 outputs scan signals (or scan voltage) in response to the gate timing control signal GDC supplied from the timing controller 120. The scan driver 130 supplies the scan signals to subpixels included in the display panel 150 though gate lines GL1 to GLm. The scan driver 130 is formed as an IC or formed directly on the display panel 150, but is not limited thereto.

However, hereinafter, for convenience of explanation, a gate-in-panel scan driver will be described as an example of the scan driver 130, as shown in FIGS. 2 and 3.

By way of example, the gate-in-panel scan driver 130 includes shift registers 130a and 130b formed at one side and the other side of a non-active area NA of the display panel 150 using a gate-in-panel technique. The shift registers 130a and 130b are formed in the form of a thin film on the non-active area NA of the display panel 150 using the gate-in-panel technique. The gate-in-panel scan driver 130 outputs scan signals Scan[1] to Scan[m] which are used to turn on or turn off the transistors formed in the active area AA of the display panel 150.

By way of example, the gate-in-panel scan driver 130 is operated based on signals and voltages output from the timing controller 120, the power supply 180, and a level shifter 160. The level shifter 160 generates gate control signals necessary to drive the gate-in-panel scan driver 130 based on signals and voltages output from the timing controller 120 and the power supply 180.

By way of example, the data driver 140 samples and latches the data signal DATA in response to the data timing control signal DDC supplied from the timing controller 120, or the like, converts the data signal DATA in a digital form into a data voltage in an analog form based on a gamma reference voltage, and outputs the converted data voltage. The data driver 140 supplies the data voltage to the subpixels included in the display panel 150 through data lines DL1 to DLn. The data driver 140 is formed as an IC and mounted on the display panel 150 or the printed circuit board, but is not limited thereto.

By way of example, the power supply 180 generates a high-level voltage and a low-level voltage based on an external input voltage supplied from the outside, and outputs the high-level voltage and the low-level voltage through high-level voltage power lines EVDD and low-level voltage power lines EVSS. The power supply 180 generates and outputs not only the high-level voltage and the low-level voltage but also voltages (for example, a gate-high voltage and a gate-low voltage) required to drive the scan driver 130 or voltages (for example, a drain voltage and a half drain voltage) required to drive the data driver 140.

By way of example, the display panel 150 is fabricated based on a substrate having stiffness or ductility, such as glass, silicon, polyimide, or the like. The display panel 150 includes a plurality of subpixels SP to display an image. The subpixels SP emit light directly toward an upper substrate or a lower substrate of the display panel 150. The subpixels SP emit light of one of a plurality of colors, such as red, green, blue, white, and the like. The display panel 150 displays an image based on pixels including a red subpixel, a green subpixel, and a blue subpixel, or pixels including a red subpixel, a green subpixel, a blue subpixel, and a white subpixel.

In the above description, the timing controller 120, the scan driver 130, the data driver 140, and the like were described as individual components. However, one or more of the timing controller 120, the scan driver 130, and the data driver 140 may be integrated into one IC depending on the implementation method of the light emitting display device.

Figure 4:
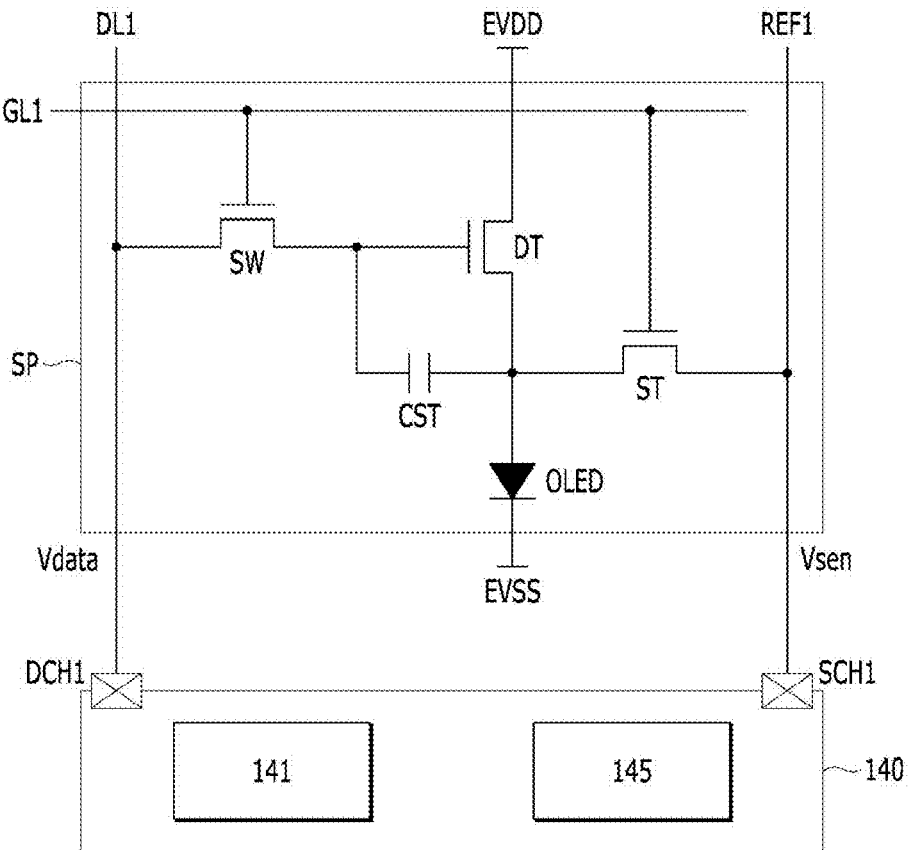
FIG. 4 is an exemplary diagram briefly showing a subpixel and a data driver according to a first embodiment.
Figure 5:
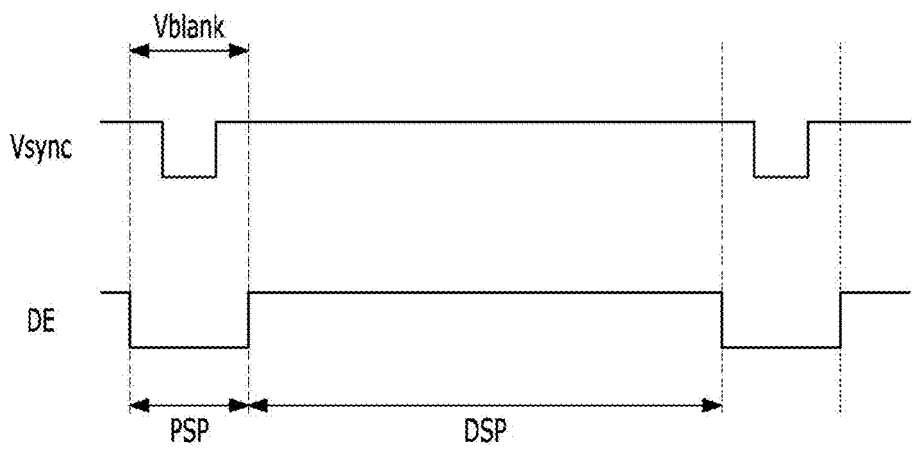
FIG. 5 is a waveform diagram for explaining a sensing period and a display period according to the first embodiment.

FIG. 4 is an exemplary diagram briefly showing a subpixel and a data driver according to a first embodiment, and FIG. 5 is a waveform diagram for explaining a sensing period and a display period according to the first embodiment.

As shown in FIG. 4, by way of example, according to the first embodiment, one subpixel SP includes a switching transistor SW, a driving transistor DT, a sensing transistor ST, a capacitor CST, and an organic light emitting diode OLED.

By way of example, the driving transistor DT has a gate electrode connected to a first electrode of the capacitor CST, a first electrode connected to a first power line EVDD, and a second electrode connected to an anode electrode of the organic light emitting diode OLED. The capacitor CST has a first electrode connected to a gate electrode of the driving transistor DT, and a second electrode connected to the anode electrode of the organic light emitting diode OLED. The organic light emitting diode OLED has the anode electrode connected to the second electrode of the driving transistor DT, and a cathode electrode connected to a second power supply line EVSS.

By way of example, the switching transistor SW has a gate electrode connected to the first gate line GL1, a first electrode connected to the first data line DL1, and a second electrode connected to the gate line of the driving transistor DT. The sensing transistor ST has a gate electrode connected to the first gate line GL1, a first electrode connected to a first reference line REF1, and a second electrode connected to the anode electrode of the organic light emitting diode OLED.

The sensing transistor ST is a type of compensation circuit added to compensate for deterioration (threshold voltage, mobility, and the like) of at least one of the driving transistor DT and the organic light emitting diode OLED. By way of example, the sensing transistor ST is operated to acquire a sensing voltage Vsen through a sensing node defined between the driving transistor DT and the organic light emitting diode OLED.

According to one embodiment, by way of example, the data driver 140 includes a driving circuit 141 configured to drive the subpixel SP, and a sensing circuit 145 configured to sense the subpixel SP. The driving circuit 141 is connected to the first data line DL1 through a first data channel DCH1. The driving circuit 141 outputs a data voltage Vdata for driving the subpixel SP through the first data channel DCH1.

By way of example, the sensing circuit 145 is connected to the first reference line REF1 through a first sensing channel SCH1. The sensing circuit 145 acquires the sensing voltage Vsen sensed from the subpixel SP through the first sensing channel SCH1. The sensing circuit 145 acquires the sensing voltage Vsen based on a current sensing method or a volage sensing method.

As shown in FIGS. 4 and 5, by way of example, according to the first embodiment, the light emitting display device drives the display panel by distinguishing between a sensing period PSP and a display period DSP based on the vertical synchronization signal Vsync, a data enable signal DE, and the like. The sensing period PSP is a period for acquiring the sensing voltage Vsen sensed from the subpixel SP, and the display period DSP is a period for displaying an image based on the subpixel SP. FIG. 5 shows as an example in which the sensing period PSP occurs in response to a vertical blank interval Vblank included in the vertical synchronization signal Vsync, but the present disclosure is not limited thereto.

Figure 6:
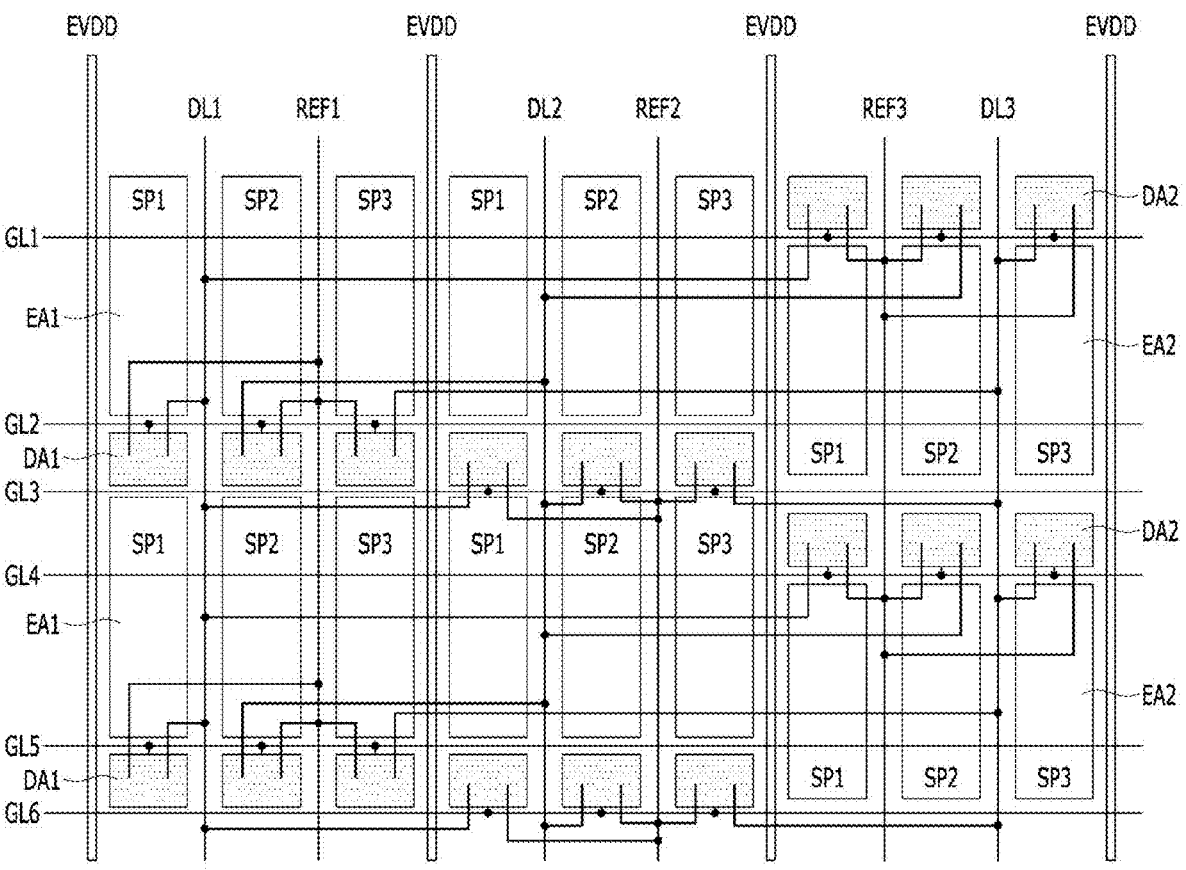
FIG. 6 is a diagram showing the plane arrangement of subpixels according to the first embodiment.
Figure 7:
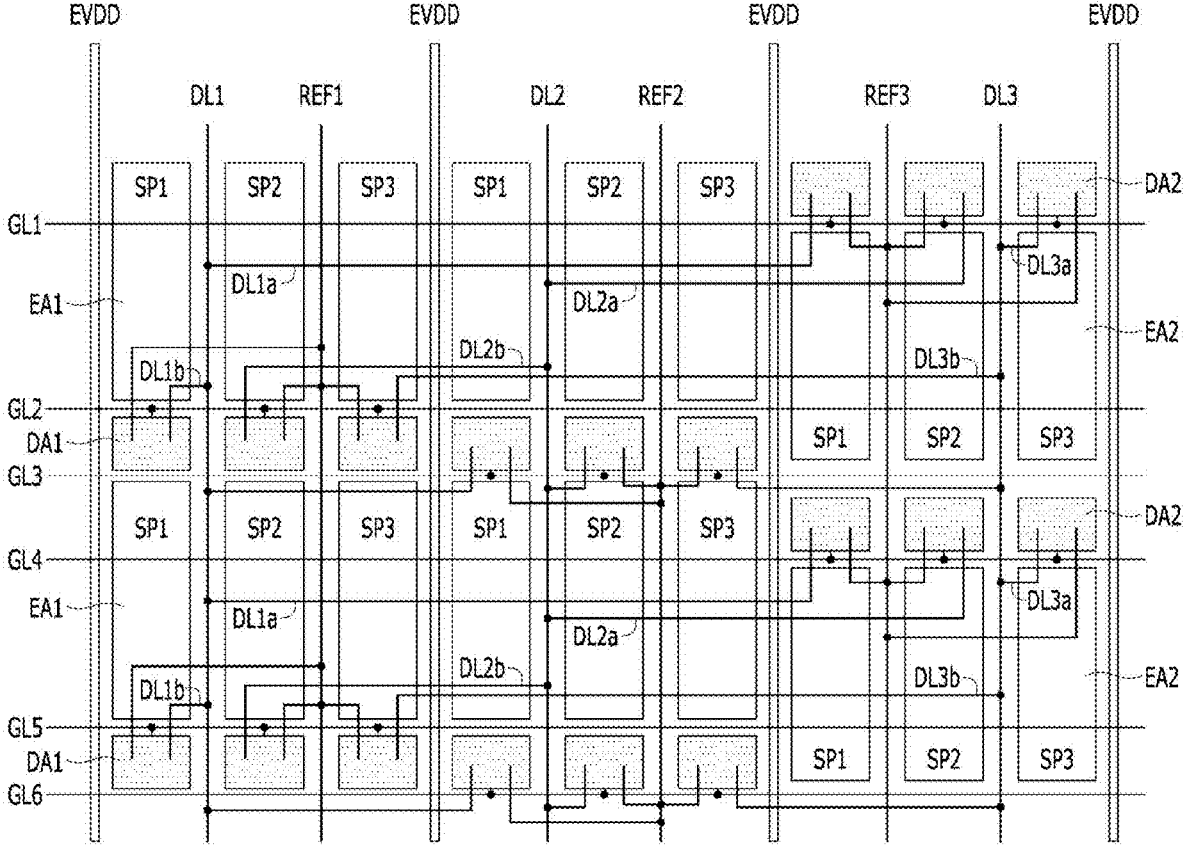
FIG. 7 is a diagram for explaining connection lines of data lines shown in FIG. 6.
Figure 8:
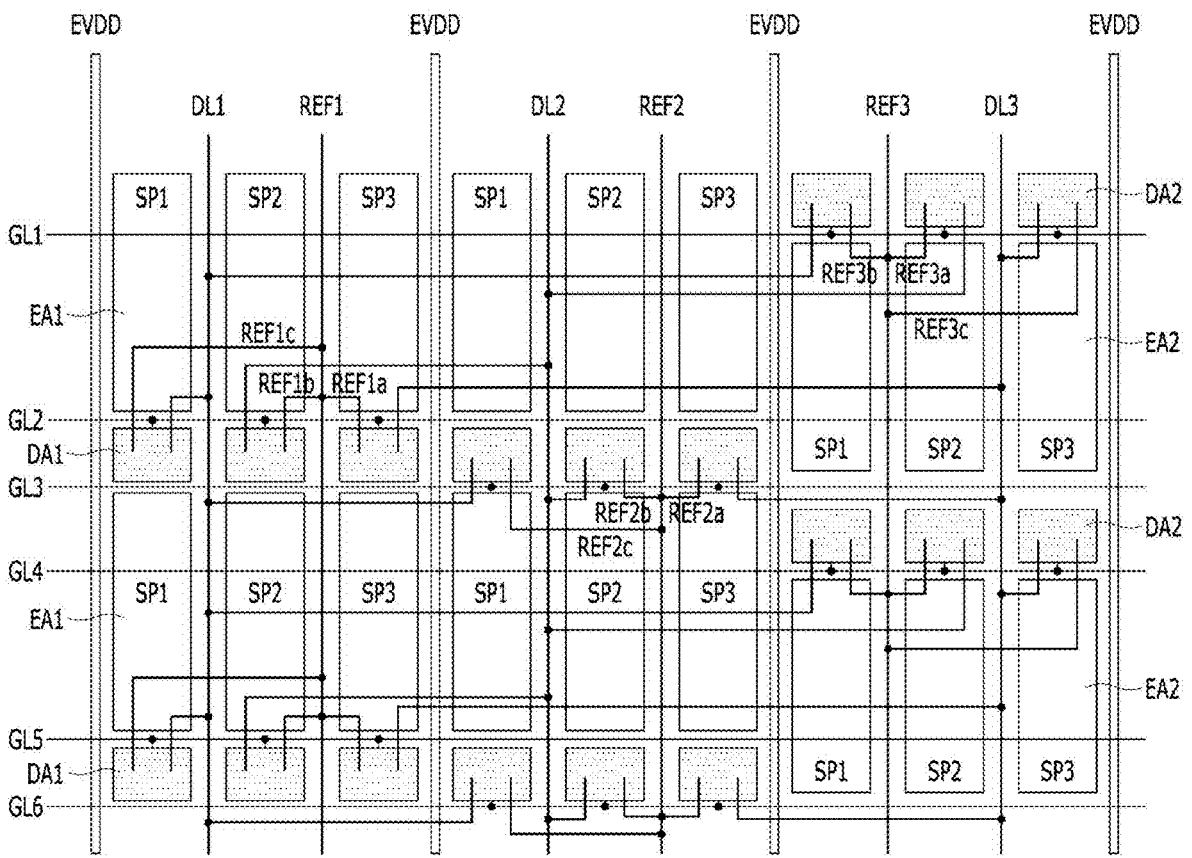
FIG. 8 is a diagram for explaining connection lines of reference lines shown in FIG. 6.
Figure 9:
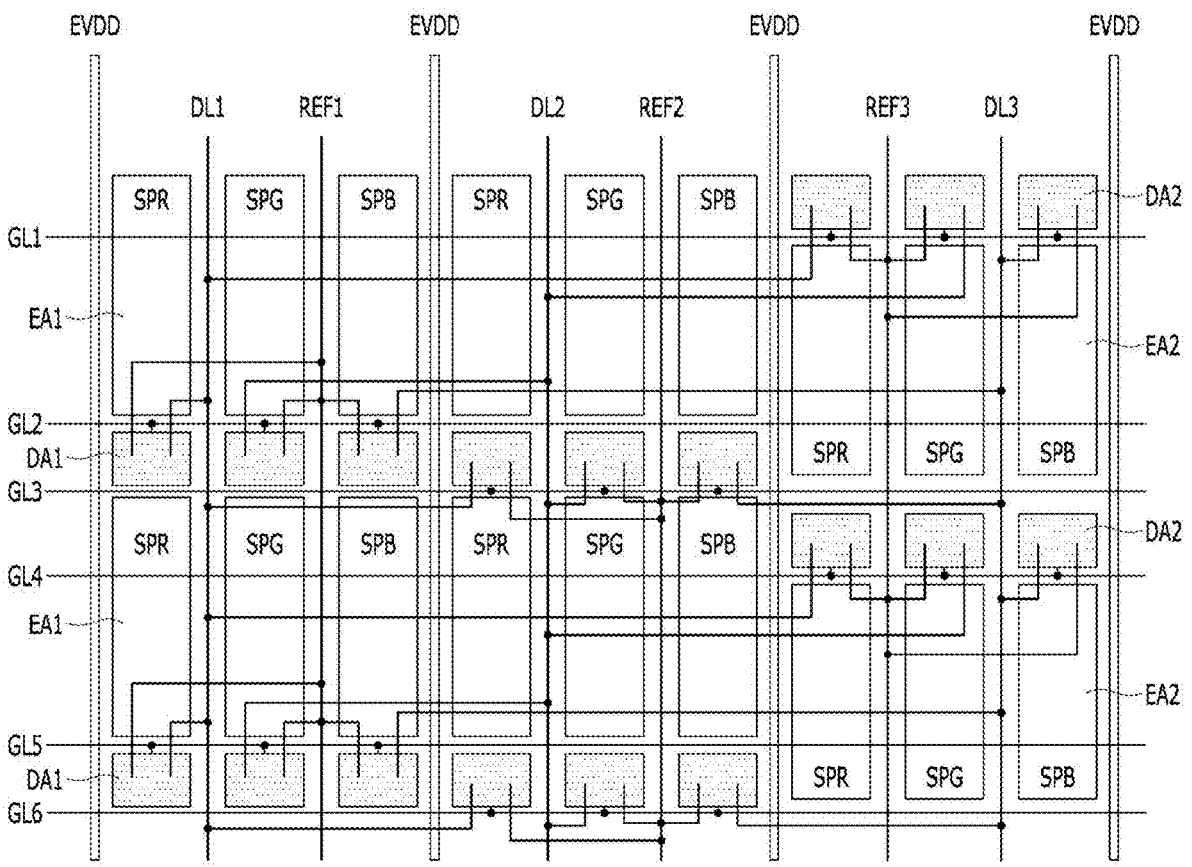
FIG. 9 is a diagram for explaining the arrangement order of the subpixels shown in FIG. 6.

FIG. 6 is a diagram showing the plane arrangement of the subpixels according to the first embodiment, FIG. 7 is a diagram for explaining connection lines of the data lines shown in FIG. 6, FIG. 8 is a diagram for explaining connection lines of reference lines shown in FIG. 6, and FIG. 9 is a diagram for explaining the arrangement order of the subpixels shown in FIG. 6.

As shown in FIG. 6, by way of example, according to the first embodiment, the display panel includes three subpixels SP1 to SP3. The subpixels SP1 to SP3 are defined by the high-level voltage power lines EVDD, the data lines DL1 to DL3, the reference lines REF1 to REF3, and the gate lines GL1 to GL6.

By way of example, the high-level voltage power lines EVDD, the data lines DL1 to DL3, and the reference lines REF1 to REF3 are wired in a first direction (vertical direction), and the gate lines GL1 to GL6 are wired in a second direction (horizontal direction).

By way of example, three subpixels SP1 to SP3 are arranged between adjacent high-level voltage power lines EVDD. Each of the subpixels SP1 to SP3 includes an emission area EA1 or EA2 and a circuit area DA1 or DA2. The emission areas EA1 and EA2 are areas where the organic light emitting diode which emits light is located, and the circuit areas DA1 and DA2 are areas where a circuit (the transistor and the like) configured to drive the organic light emitting diode is located.

By way of example, the emission areas EA1 and EA2 and the circuit areas DA1 and DA2 of the subpixels SP1 to SP3 are not be arranged identically on the display panel, and some of emission areas EA1 and EA2 and the circuit areas DA1 and DA2 are arranged to be inverted. For example, each of the subpixels SP1 to SP3 arranged adjacent to the first data line DL1 and the first reference line REF1 and each of the subpixels SP1 to SP3 arranged adjacent to the second data line DL2 and the second reference line REF2 includes a first emission area EA1 arranged in an upper region and a first circuit area DA1 arranged in a lower region. In contrast, each of the subpixels SP1 to SP3 arranged adjacent to the third data line DL3 and the third reference line REF3 includes a second emission area EA2 arranged in a lower region and a second circuit area DA2 arranged in an upper region.

Therefore, by way of example, the subpixels SP1 to SP3 including the first emission area EA1 and the first circuit area DA1 are defined as non-inverted (top and bottom non-inverted or non-flip upside down) arrangement structures (non-inverted subpixels), and the subpixels SP1 to SP3 including the second emission area EA2 and the second circuit area DA2 are defined as inverted (top and bottom inverted or flip upside down) arrangement structures (inverted subpixels).

According to the first embodiment, by way of example, the gate lines GL1 to GL6 are wired such that three gate lines are arranged on one horizontal line. For example, a first gate line GL1, a second gate line GL2, and a third gate line GL3 are arranged on a first horizontal line, and a fourth gate line GL4, a fifth gate line GL5, and a sixth gate line GL6 are arranged on a second horizontal line located after the first horizontal line.

By way of example, the first gate line GL1 is arranged to pass between the second emission areas EA2 and the second circuit areas DA2. The first gate line GL1 is commonly connected to the gate electrodes of the switching transistors and the sensing transistors included in the second circuit areas DA2 of the subpixels SP1 to SP3 arranged adjacent to the third data line DL3 and the third reference line REF3.

By way of example, the first gate line GL1 is arranged to pass through the first emission areas EA1 of the subpixels SP1 to SP3 arranged adjacent to the first data line DL1 and the first reference line REF1 and the first emission areas EA1 of the subpixels SP1 to SP3 arranged adjacent to the second data line DL2 and the second reference line REF2.

By way of example, the second gate line GL2 is arranged to pass between the first emission areas EA1 and the first circuit areas DA1. The second gate line GL2 is commonly connected to the gate electrodes of the switching transistors and the sensing transistors included in the first circuit areas DA1 of the subpixels SP1 to SP3 arranged adjacent to the first data line DL1 and the first reference line REF1.

By way of example, the second gate line GL2 is arranged to pass through the second emission areas EA2 of the subpixels SP1 to SP3 arranged adjacent to the third data line DL3 and the third reference line REF3.

By way of example, the third gate line GL3 is arranged to pass between the first circuit areas DA1 arranged on the first horizontal line and the first emission areas EA1 arranged on the second horizontal line. The third gate line GL3 is commonly connected to the gate electrodes of the switching transistors and the sensing transistors included in the first circuit areas DA1 of the subpixels SP1 to SP3 arranged adjacent to the second data line DL2 and the second reference line REF2.

By way of example, unlike the first gate line GL1 and the second gate line GL2, the third gate line GL3 is arranged to pass through a non-emission area defined between the first horizontal line and the second horizontal line.

Further, by way of example, one horizontal line is defined by three gate lines (for example, GL1 to GL3), and the emission areas EA1 and EA2 and the circuit areas DA1 and DA2 of the subpixels SP1 to SP3 connected thereto.

As shown in FIG. 7, by way of example, according to the first embodiment, the data lines DL1 to DL3 include data connection lines DL1a and DL1b, DL2a and DL2b, and DL3a and DL3b, which are wired in the second direction and provide electrical connection to the subpixels SP1 to SP3, respectively. The data connection lines DL1a and DL1b, DL2a and DL2b, and DL3a and DL3b are arranged to pass through the emission areas EA1 and EA2.

By way of example, the first data line DL1 incudes 1-1 data connection lines DL1a configured to connect the first electrodes of the switching transistors included in the second circuit areas DA2 of the first subpixels SP1 arranged adjacent to the third reference line REF3 to the first data line DL1, and 1-2 data connection lines DL1b configured to connect the first electrodes of the switching transistors included in the first circuit areas DA1 of the first subpixels SP1 arranged adjacent to the first reference line REF1 to the first data line DL1. The 1-1 data connection lines DL1a connect the first electrodes of the switching transistors included in the second circuit areas DA2 of the first subpixels SP1, which are far away from the first data line DL1, to the first data line DL1, and thus have a longer wiring length than the 1-2 data connection lines DL1b.

By way of example, The second data line DL2 includes 2-1 data connection lines DL2a configured to connect the first electrodes of the switching transistors included in the second circuit areas DA2 of the second subpixels SP2 arranged adjacent to the third reference line REF3 to the second data line DL2, and 2-2 data connection lines DL2b configured to connect the first electrodes of the switching transistors included in the first circuit areas DA1 of the second subpixels SP2 arranged adjacent to the first reference line REF1 to the second data line DL2. The 2-1 data connection lines DL2a connect the first electrodes of the switching transistors included in the second circuit areas DA2 of the second subpixels SP2, which are far away from the second data line DL2, to the second data line DL2, and thus have a longer wiring length than the 2-2 data connection lines DL2b.

By way of example, the third data line DL3 includes 3-1 data connection lines DL3a configured to connect the first electrodes of the switching transistors included in the second circuit areas DA2 of the third subpixels SPs arranged adjacent to the third reference line REF3 to the third data line DL3, and 3-2 data connection lines DL3b configured to connect the first electrodes of the switching transistors included in the first circuit areas DA1 of the third subpixels SP3 arranged adjacent to the first reference line REF1 to the third data line DL3. The 3-2 data connection lines DL3b connect the first electrodes of the switching transistors included in the first circuit areas DA1 of the third subpixels SP3, which are far away from the third data line DL3, to the third data line DL3, and thus have a longer wiring length than the 3-1 data connection lines DL3a.

As shown in FIG. 8, by way of example, according to the first embodiment, the reference lines REF1 to REF3 include reference connection lines REF1a to REF1c, REF2a to REF2c, and REF3a to REF3c, which are wired in the second direction, respectively. The reference connection lines REF1a to REF1c, REF2a to REF2c, and REF3a to REF3c are arranged to pass through the emission areas EA1 and EA2.

By way of example, the first reference line REF1 includes three reference connection lines REF1a to REF1c configured to commonly connect the first electrodes of the sensing transistors included in the first circuit areas DA1 of the first subpixel SP1 to the third subpixel SP3, arranged adjacent to the left and right sides of the first reference line REF1, to the first reference line REF1. The three reference connection lines REF1a to REF1c included in the first reference line REF1 are located on the first horizontal line, and are arranged to traverse the first emission areas EA1 of the first subpixel SP1 to the third subpixel SP3.

By way of example, the second reference line REF2 includes three reference connection lines REF2a to REF2c configured to commonly connect the first electrodes of the sensing transistors included in the first circuit areas DA1 of the first subpixel SP1 to the third subpixel SP3, arranged adjacent to the left and right sides of the second reference line REF2, to the second reference line REF2. The three reference connection lines REF2a to REF2c included in the second reference line REF2 are located on the second horizontal line, and are arranged to traverse the first emission areas EA1 of the first subpixel SP1 to the third subpixel SP3.

By way of example, the third reference line REF3 includes three reference connection lines REF3a to REF3c configured to commonly connect the first electrodes of the sensing transistors included in the second circuit areas DA2 of the first subpixel SP1 to the third subpixel SP3, arranged adjacent to the left and right sides of the third reference line REF3, to the third reference line REF3. The three reference connection lines REF3a to REF3c included in the third reference line REF3 are located on the first line, and are arranged to traverse the second emission areas EA2 of the first subpixel SP1 to the third subpixel SP3.

By way of example, the first to third subpixels SP1 to SP3 described above with reference to FIGS. 6 to 8 are arranged in the order of a red subpixel SPR, a green subpixel SPG, and a blue subpixel SPB, as shown in FIG. 9. The first to third subpixels SP1 to SP3 described above with reference to FIGS. 6 to 8 are repeatedly arranged on the first horizontal line and the second horizontal line, as shown in FIG. 9. That is, the subpixels formed in the arrangement structure and the wiring structure on the first horizontal line are formed on all horizontal lines of the display panel.

As can be seen with reference to FIG. 7 together with FIG. 9, by way of example, the data connection lines DL1a and DL1b, and DL3a and DL3b, which connect the red subpixels SPR and the blue subpixels SPB to the first data line DL1 and the third data line DL3, are completely symmetrical to each other horizontally and vertically. In contrast, the data connection lines DL2a and DL2b, which connect the green subpixels SPG to the second data line DL2, are pseudosymmetrical (nearly symmetrical) horizontally and vertically with respect to the second data line DL2.

In addition, by way of example, the red subpixel SPR and the green subpixel SPG has a structure in which the data line DL1 or DL2 is arranged on the left and the reference line REF1 or REF2 is arranged on the right. In contrast, the blue subpixel SPB has a structure in which the reference line REF3 is arranged on the left and the data line DL3 is arranged on the right.

That is, the subpixels having the non-inverted arrangement (normal arrangement) structure including the first emission area EA1 and the first circuit area DA1 have a structure in which the reference line is arranged after the data line, but the subpixels having the inverted arrangement structure including the second emission area EA2 and the second circuit area DA2 have a structure in which the data line arranged after the reference line.

In the first embodiment, by way of example, pixels are arranged 2:1 based on two non-inverted pixels and one inverted pixel, thereby being capable of preventing occurrence of twisting and short-circuit between respective wirings when implementing a display panel. Further, in the first embodiment, data lines and gate lines are arranged in a straight line based on the non-inverted pixels and the inverted pixels arranged 2:1, thereby being capable of maximizing an aperture ratio when implementing a display panel. In addition, in the first embodiment, the charging order of the subpixels with a data voltage is defined and changed based on the non-inverted pixels and the inverted pixels arranged 2:1, thereby being capable of minimizing increase in RC delay of the data lines while enabling column inversion when implementing a display panel.

Hereinafter, a second embodiment in which the previously-described first embodiment is implemented in a more specific form will be described. However, the second embodiment will be described while focusing on more specific parts thereof than the first embodiment.

Figure 10:
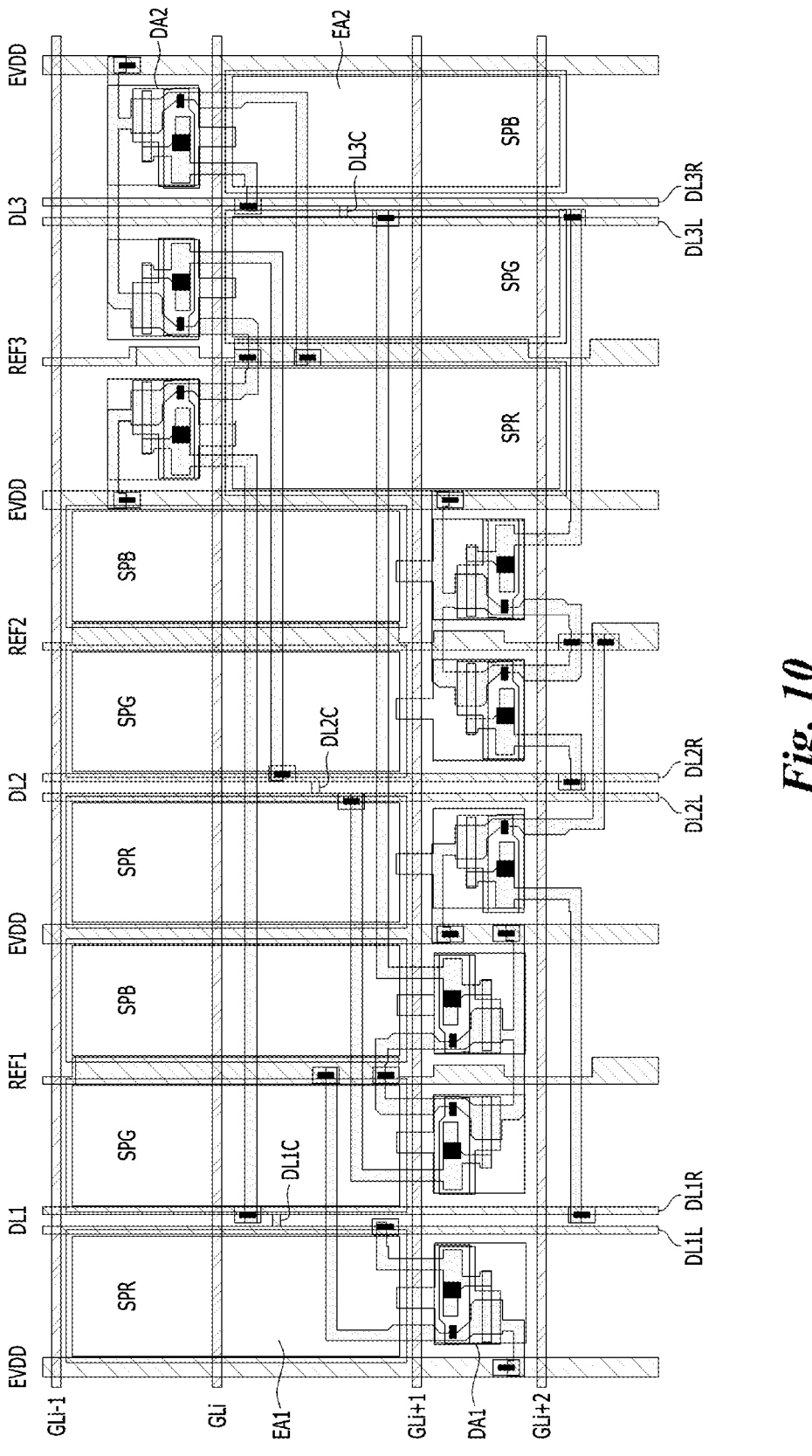
FIG. 10 is a diagram showing the plane arrangement of subpixels according to a second embodiment.
Figure 11:
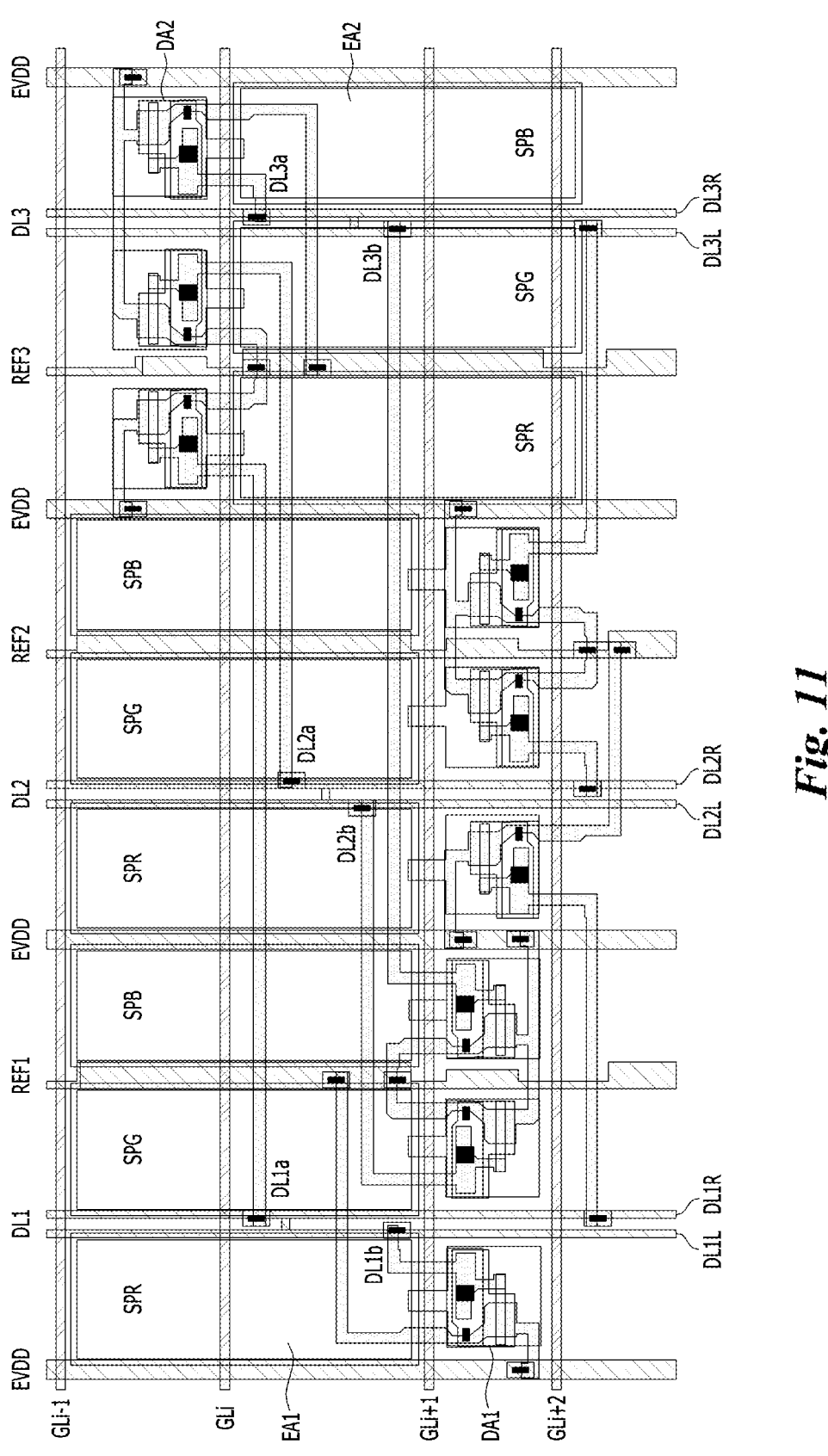
FIG. 11 is a diagram for explaining connection lines of data lines shown in FIG. 10.
Figure 12:
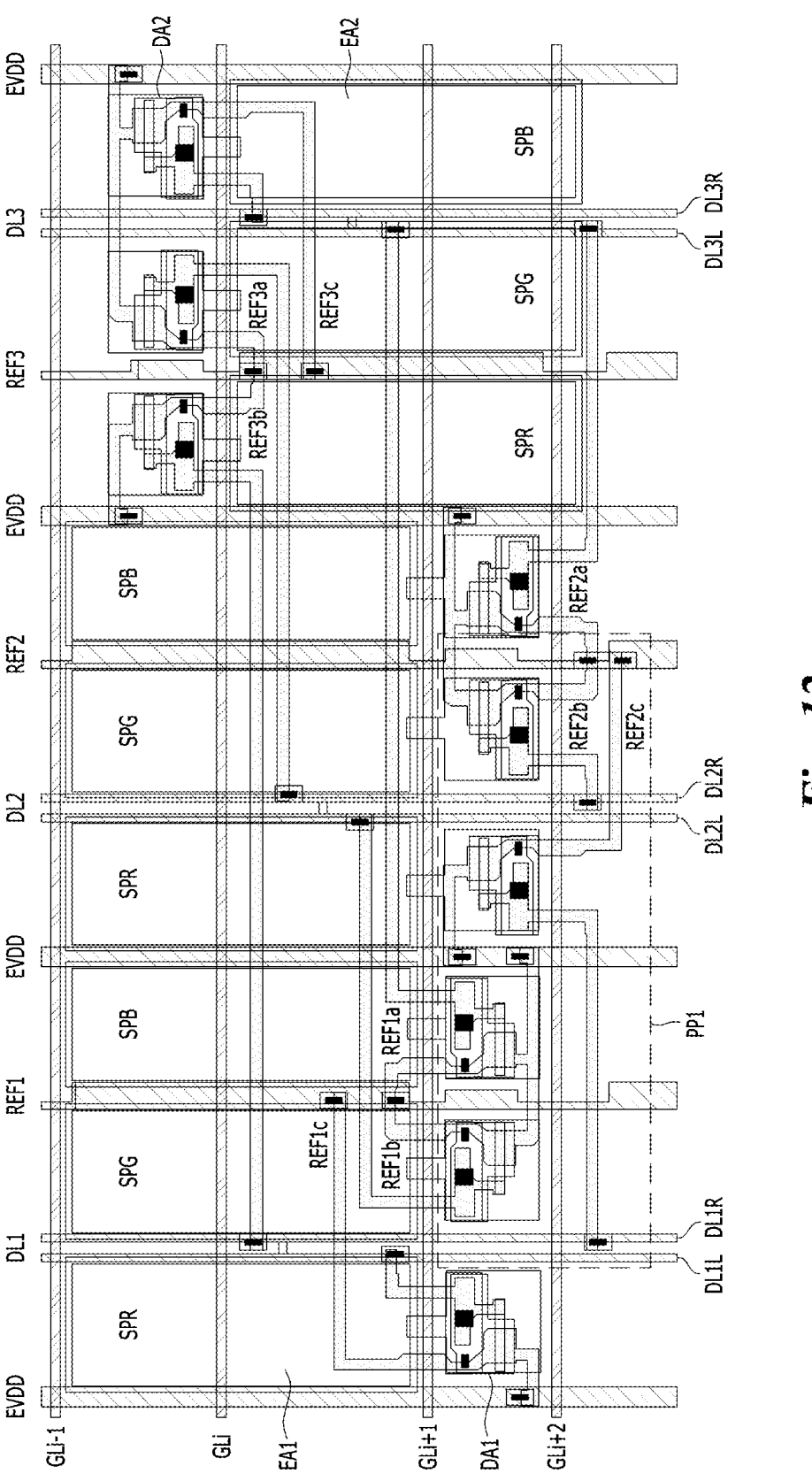
FIG. 12 is a diagram for explaining connection lines of reference lines shown in FIG. 10.
Figure 13:
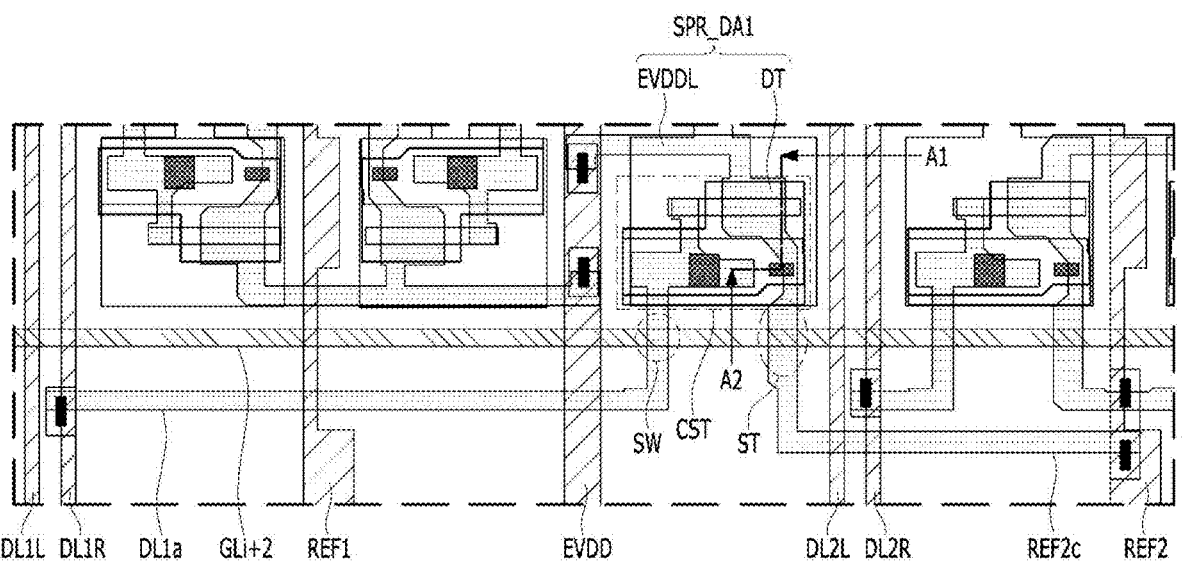
FIG. 13 is an enlarged diagram of portion PP1 of FIG. 12.
Figure 14:
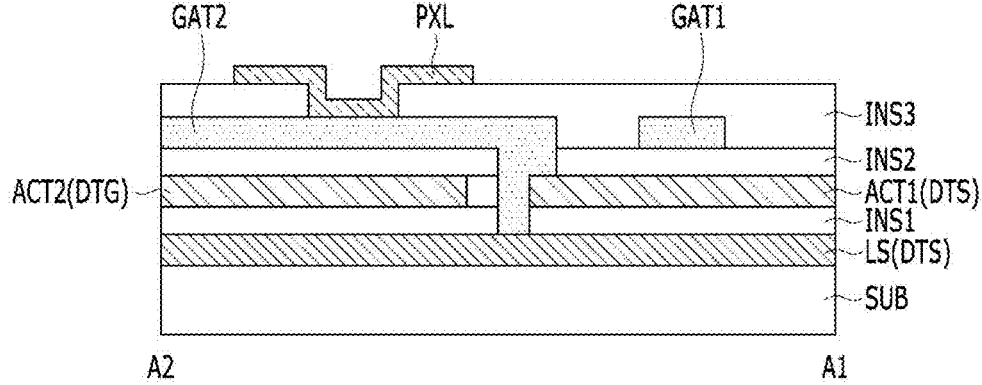
FIG. 14 is a cross-sectional diagram taken along line A1-A2 of FIG. 13.

FIG. 10 is a diagram showing the plane arrangement of subpixels according to the second embodiment, FIG. 11 is a diagram for explaining connection lines of data lines shown in FIG. 10, FIG. 12 is a diagram for explaining connection lines of reference lines shown in FIG. 10, FIG. 13 is an enlarged diagram of portion PP1 of FIG. 12, and FIG. 14 is a cross-sectional diagram taken along line A1-A2 of FIG. 13.

As shown in FIGS. 10 to 12, by way of example, according to the second embodiment, a display panel includes three subpixels SPR, SPG, and SPB. The subpixels SPR, SPG, and SPB are defined by high-level voltage power lines EVDD, data lines DL1 to DL3, reference lines REF1 to REF3, and gate lines GLi−1 to GLi+2. Here, GLi−1 refers to a gate line included in a horizontal line located prior to three gate lines GLi to GLi+2 located on one horizontal line.

By way of example, the high-level voltage power lines EVDD, the data lines DL1 to DL3, and the reference lines REF1 to REF3 are wired in a first direction (vertical direction), and the gate lines GLi−1 to GLi+2 are wired in a second direction (horizontal direction).

By way of example, three subpixels SPR, SPG, and SPB are arranged between adjacent high-level voltage power lines EVDD. Each of the subpixels SPR, SPG, and SPB includes an emission area EA1 or EA2 and a circuit area DA1 or DA2. The subpixels SPR, SPG, and SPB including the first emission area EA1 and the first circuit area DA1 are defined as non-inverted arrangement structures (non-inverted subpixels), and the subpixels SPR, SPG, and SPB including the second emission area EA2 and the second circuit area DA2 are defined as inverted arrangement structures (inverted subpixels).

According to the second embodiment, by way of example, the data lines DL1 to DL3 include two data lines DL1L and DL1R, DL2L and DL2R, and DL3L and DL3R, which are spaced apart from each other, and connection electrodes DL1C, DL2C, and DL3C configured to connect the data lines DL1L and DL1R, DL2L and DL2R, and DL3L and DL3R, respectively.

For example, the first data line DL1 includes a 1-1 data line DL1L and a 1-2 data line DL1R, and the 1-1 data line DL1L and the 1-2 data line DL1R are connected by a first connection electrode DL1C. The second data line DL2 includes a 2-1 data line DL2L and a 2-2 data line DL2R, and the 2-1 data line DL2L and the 2-2 data line DL2R are connected by a second connection electrode DL2C. The third data line DL3 includes a 3-1 data line DL3L and a 3-2 data line DL3R, and the 3-1 data line DL3L and the 3-2 data line DL3R are connected by a third connection electrode DL3C.

As shown in FIG. 11, by way of example, according to the second embodiment, the data lines DL1 to DL3 include data connection lines DL1a and DL1b, DL2a and DL2b, and DL3a and DL3b, which are wired in the second direction, respectively. The data connection lines DL1a and DL1b, DL2a and DL2b, and DL3a and DL3b are formed based on a semiconductor layer.

As shown in FIG. 12, by way of example, according to the second embodiment, the reference lines REF1 to REF3 include reference connection lines REF1a to REF1c, REF2a to REF2c, and REF3a to REF3c, which are wired in the second direction, respectively. The reference connection lines REF1a to REF1c, REF2a to REF2c, and REF3a to REF3c are formed based on the semiconductor layer.

By way of example, because the data connection lines DL1a and DL1b, DL2a and DL2b, and DL3a and DL3b and the reference connection lines REF1a to REF1c, REF2a to REF2c, and REF3a to REF3c are formed based on the semiconductor layer, but are used as wirings configured to connect different lines, and the data connection lines DL1a and DL1b, DL2a and DL2b, and DL3a and DL3b and the reference connection lines REF1a to REF1c, REF2a to REF2c, and REF3a to REF3c do not overlap each other.

Further, the high-level voltage power lines EVDD and the data lines DL1 to DL3 are formed based on a lower metal layer located as the lowermost layer on a substrate, the gate lines GLi−1 to GLi+2 are formed based on a gate metal layer located above the semiconductor layer, and this will be described below.

Referring to the first circuit area SPR_DA1 of the red subpixel shown in FIG. 13, by way of example, a switching transistor SW is defined by an area where the first data connection line DL1a and the I+2$^{th}$ gate line GLi+2 overlap each other. A sensing transistor ST is defined by an area where the 2-3 reference connection line REF2c and the I+2$^{th}$ gate line GLi+2 overlap each other. A driving transistor DT is defined by a gate electrode area DTG defined by the first data connection line DL1a, a drain electrode area defined by a voltage connection line EVDDL connected to the high-level voltage power line EVDD, and a source electrode area DTS defined by the 2-3 reference connection line REF2c. A capacitor CST is defined by an overlap area of the electrodes included in the driving transistor DT.

Referring to FIGS. 10 to 14, by way of example, a lower metal layer LS is formed on a substrate SUB. The lower metal layer LS is connected to a first semiconductor layer ACT1 by a second gate metal layer GAT2 to form the source electrode area DTS of the driving transistor DT. Further, the lower metal layer LS is used as a layer separately patterned to form the high-level voltage power lines EVDD and the data lines DL1 to DL3.

By way of example, a first insulating layer INS1 is located on the lower metal layer LS, and the first semiconductor layer ACT1 and a second semiconductor layer ACT2, which are patterned separately from each other, are located on the first insulating layer INS1. The first semiconductor layer ACT1 forms the source electrode area DTS of the driving transistor DT. The second semiconductor layer ACT2 forms the gate electrode area DTG of the driving transistor DT. Further, the first semiconductor layer ACT1 and the second semiconductor layer ACT2 are used as layers which are patterned separately to form the data connection lines DL1a and DL1b, DL2a and DL2b, and DL3a and DL3b, and the reference connection lines REF1a to REF1c, REF2a to REF2c, and REF3a to REF3c.

By way of example, a second insulating layer INS2 is located on the first semiconductor layer ACT1 and the second semiconductor layer ACT2, and a first gate metal layer GAT1 and a second gate metal layer GAT2 patterned separately from each other are located on the second insulating layer INS2. The first gate metal layer GAT1 is defined as a gate electrode of the driving transistor DT, and the second gate metal layer GAT2 is defined as an electrode which connects the lower metal layer LS, the first semiconductor layer ACT1, and a pixel electrode layer PXL. Further, the first gate metal layer GAT1 and the second gate metal layer GAT2 are used as layers which are patterned separately to form the gate lines GLi−1 to GLi+2.

By way of example, a third insulating layer INS3 is located on the first gate metal layer GAT1 and the second gate metal layer GAT2, and the pixel electrode layer PXL is located on the third insulating layer INS3. The pixel electrode layer PXL is defined as an anode of an organic light emitting diode.

Figure 15:
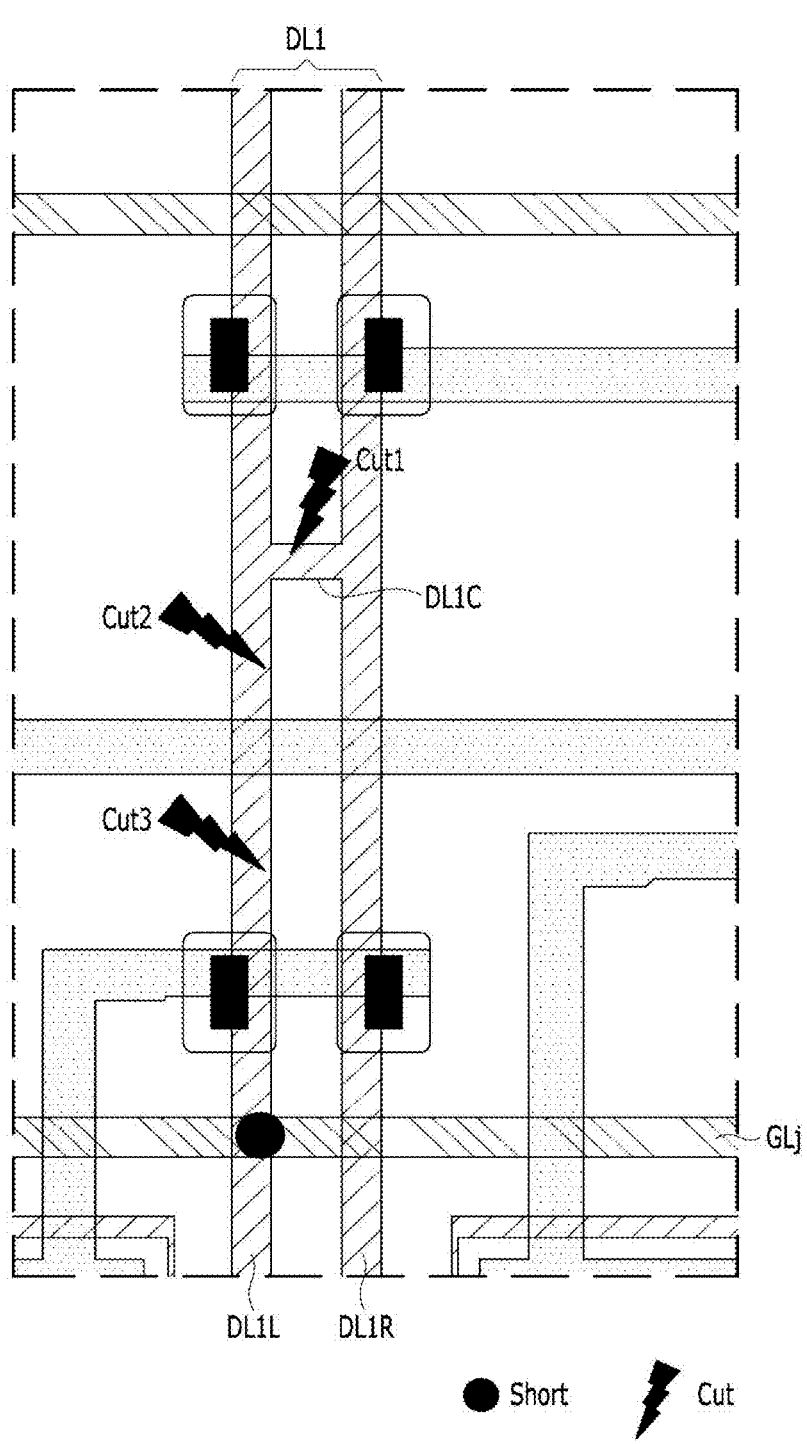
FIGS. 15 and 16 are diagrams for explaining the advantages of a data line structure according to the second embodiment.
Figure 16:
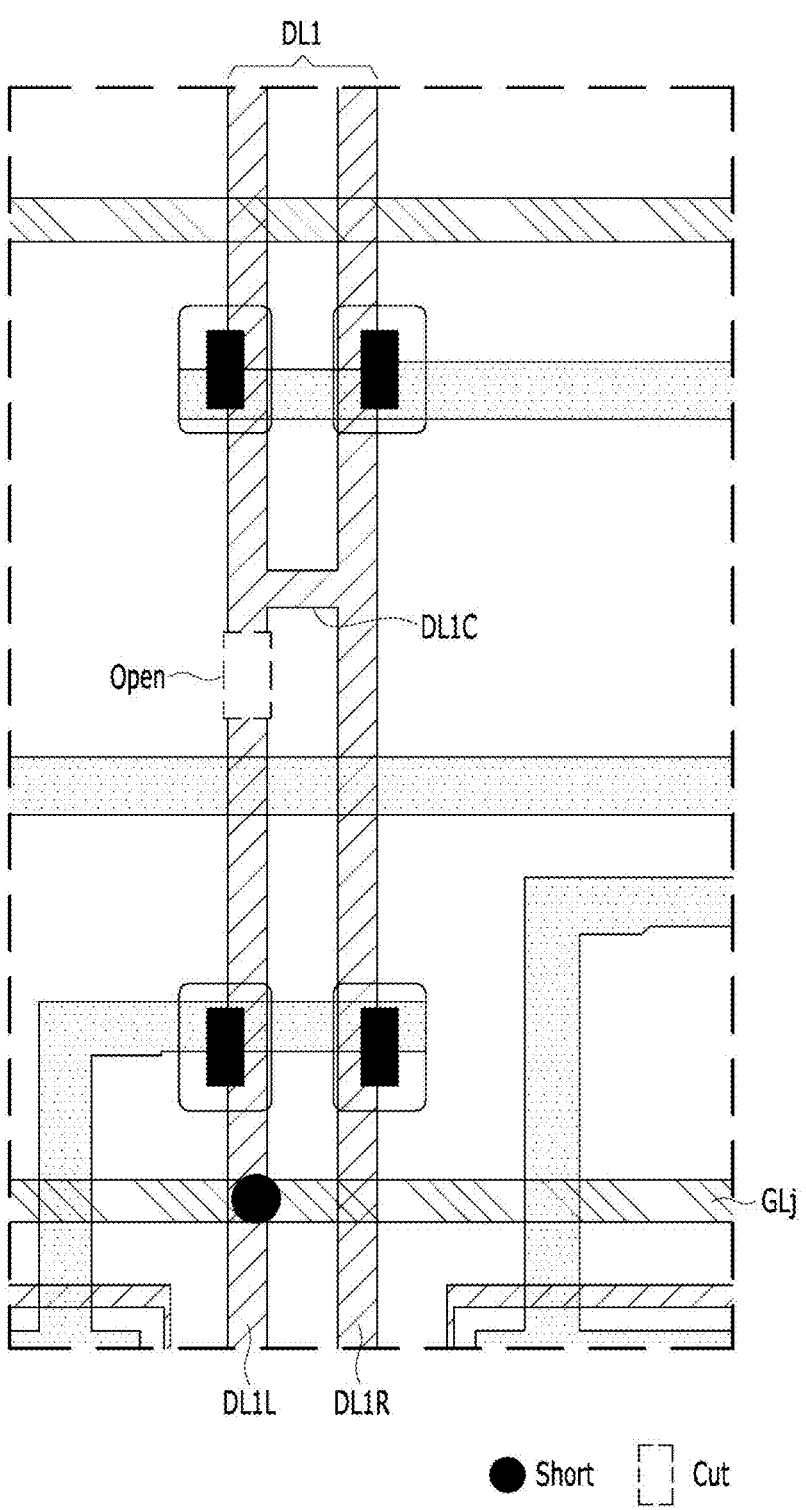

FIGS. 15 and 16 are diagrams for explaining the advantages of a data line structure according to the second embodiment.

As shown in FIG. 15, by way of example, the 1-1 data line DL1L and the 1-2 data line DL1R are connected by the first connection electrode DL1C. Although the first data line DL1 and the J$^{th}$ gate line GLj are located in different layers, short-circuit therebetween may occur in an overlapping area between the first data line DL1 and the J$^{th}$ gate line GLj due to various reasons during a manufacturing process.

By way of example, the first data line DL1 according to the second embodiment has a structure divided into one data line and the other data line, i.e., the 1-1 data line DL1L and the 1-2 data line DL1R. Therefore, when a short-circuit occurs between the first data line DL1 and the J$^{th}$ gate line GLj, repair may be performed by cutting at least one of a first cut part Cut1, a second cut part Cut2, and a third cut part Cut3. FIG. 16 is a diagram showing formation of an open area Open by cutting the second cut part Cut 2, as an example.

In addition, by way of example, according to the second embodiment, lines which transmit signals, such as the first data line DL1 as well as the J$^{th}$ gate line GLj, are arranged in a straight line. When the signal transmitting lines are arranged in a straight line, the possibility of occurrence of a short-circuit due to increase in the number of connection lines (connection electrodes) is minimized.

Figure 17:
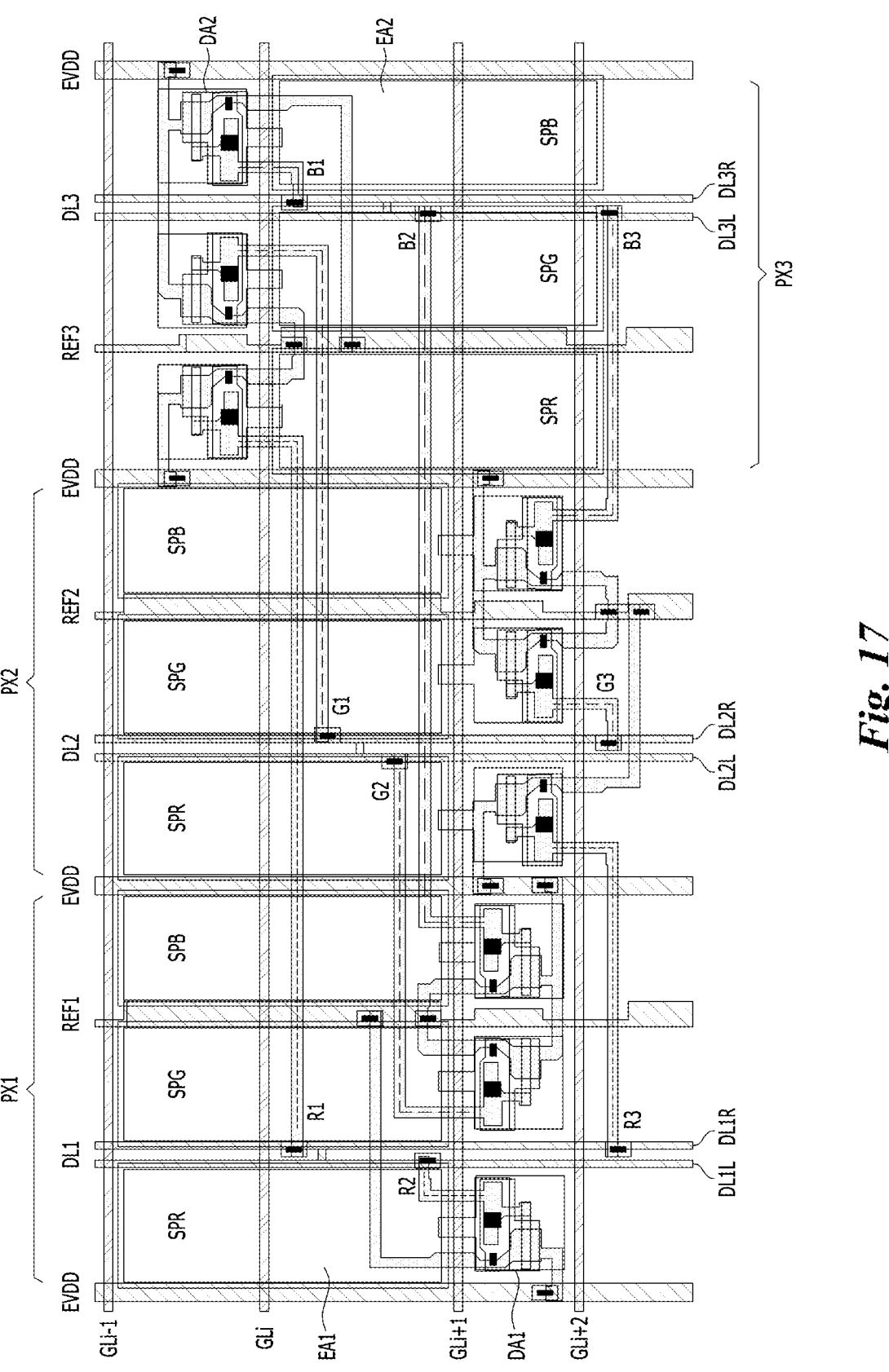
FIG. 17 is a diagram showing the charging order of subpixels according to the second embodiment.
Figure 18:
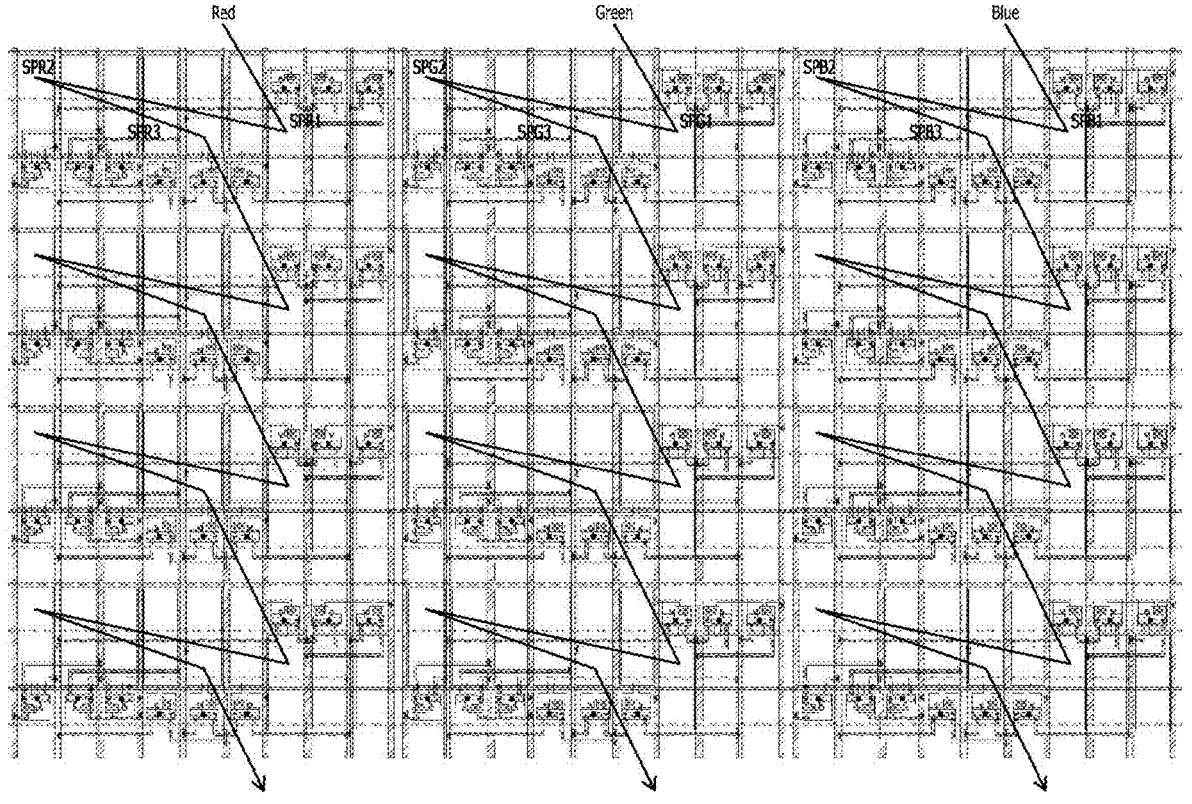
FIG. 18 is a diagram showing the charging order of the respective subpixels with a data voltage shown on the entirety of a display panel corresponding to the charging order shown in FIG. 17.

FIG. 17 is a diagram showing the charging order of subpixels according to the second embodiment, and FIG. 18 is a diagram showing the charging order of the respective subpixels with a data voltage throughout the entirety of the display panel corresponding to the charging order shown in FIG. 17.

As shown in FIG. 17, according to the second embodiment, a red subpixel SPR included in a third pixel PXL3 is farthest away from the first data line DL1 but is operated by a gate signal from the I$^{th}$ gate line GLi, and thus, the red subpixel SPR included in the third pixel PXL3 is charged with the data voltage first among the shown red subpixels (with reference to R1).

Next, a red subpixel SPR included in a first pixel PXL1 is closest to the first data line DL1 but is operated by a gate signal from the I+1$^{th}$ gate line GLi+1 located next to the I$^{th}$ gate line GLi, and thus, the red subpixel SPR included in the first pixel PXL1 is charged with the data voltage second among the shown red subpixels (with reference to R2).

Next, a red subpixel SPR included in a second pixel PXL2 is the second farthest away from the first data line DL1 but is operated by a gate signal from the I+2$^{th}$ gate line GLi+2 located next to the I+2$^{th}$ gate line GLi+1, and thus, the red subpixel SPR included in the second pixel PXL2 is charged with the data voltage third among the shown red subpixels (with reference to R3).

A green subpixel SPG included in the third pixel PXL3 is farthest away from the second data line DL2 but is operated by the gate signal from the I$^{th}$ gate line GLi, and thus, the green subpixel SPG included in the third pixel PXL3 is charged with the data voltage first among the shown green subpixels (with reference to G1).

Next, a green subpixel SPR included in the first pixel PXL1 is the second farthest away from the second data line DL2 but is operated by the gate signal from the I+1$^{th}$ gate line GLi+1 located next to the I$^{th}$ gate line GLi, and thus, the green subpixel SPG included in the first pixel PXL1 is charged with the data voltage second among the shown green subpixels (with reference to G2).

Next, a green subpixel SPG included in the second pixel PXL2 is closest to the second data line DL2 but is operated by the gate signal from the I+2$^{th}$ gate line GLi+2 located next to the I+2$^{th}$ gate line GLi+1, and thus, the green subpixel SPG included in the second pixel PXL2 is charged with the data voltage third among the shown green subpixels (with reference to G3).

A blue subpixel SPB included in the third pixel PXL3 is closest to the third data line DL3 but is operated by the gate signal from the I$^{th}$ gate line GLi, and thus, the blue subpixel SPB included in the third pixel PXL3 is charged with the data voltage first among the shown blue subpixels (with reference to B1).

Next, a blue subpixel SPB included in the first pixel PXL1 is farthest away from the third data line DL3 but is operated by the gate signal from the I+1$^{th}$ gate line GLi+1 located next to the I$^{th}$ gate line GLi, and thus, the blue subpixel SPB included in the first pixel PXL1 is charged with the data voltage second among the shown blue subpixels (with reference to B2).

Next, a blue subpixel SPB included in the second pixel PXL2 is the second farthest away from the third data line DL3 but is operated by the gate signal from the I+2$^{th}$ gate line GLi+2 located next to the I+2$^{th}$ gate line GLi+1, and thus, the blue subpixel SPB included in the second pixel PXL2 is charged with the data voltage third among the shown blue subpixels (with reference to B3).

According to the above description with reference to FIG. 17, by way of example, the charging order of the respective subpixels (each of red, green, and blue subpixels) with the data voltage shown on the entire display panel is formed in a zigzag shape, as shown in FIG. 18. For example, the subpixels SPR1, SPG1, and SPB1 included in the inverted pixel is charged first, the subpixels SPR2, SPG2, and SPB2 included in the non-inverted pixel located on the left is charged second, and the subpixels SPR2, SPG2, and SPB2 included in the non-inverted pixel located on the right is charged third.

Figure 19:
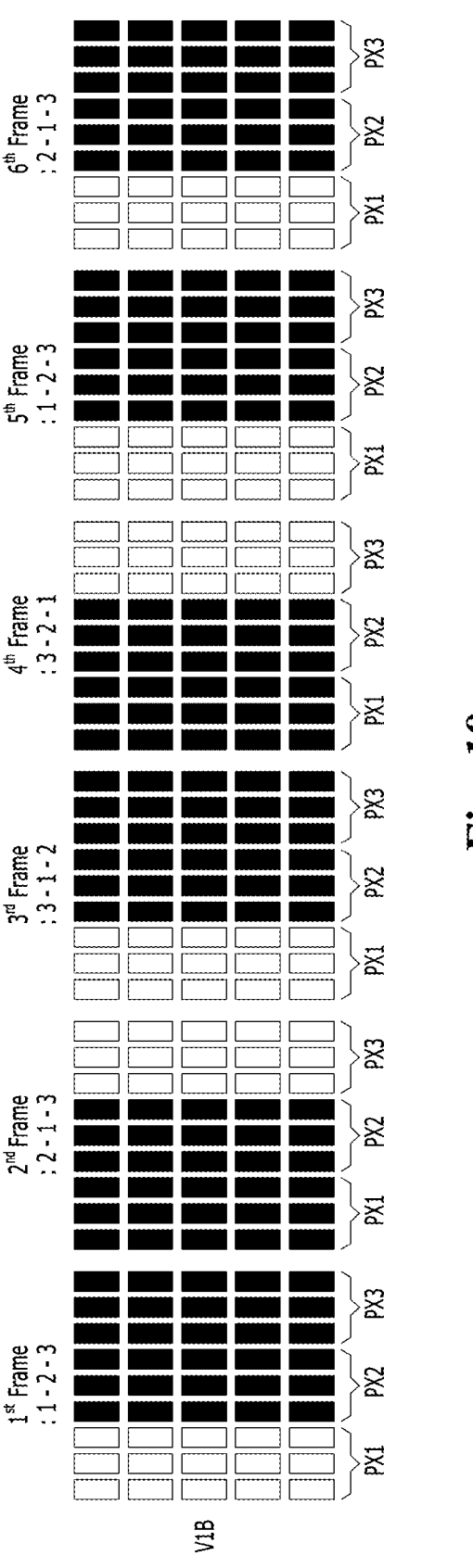
FIGS. 19 to 21 are diagrams showing evaluation results when three types of inversion methods were performed over a total six frames based on the second embodiment.
Figure 20:
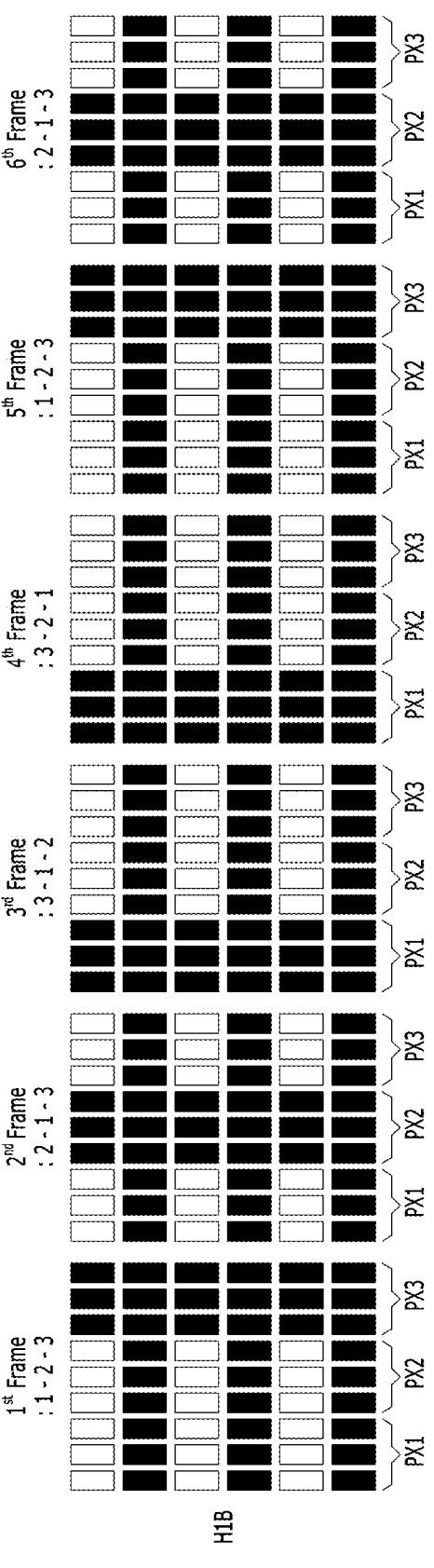
Figure 21:
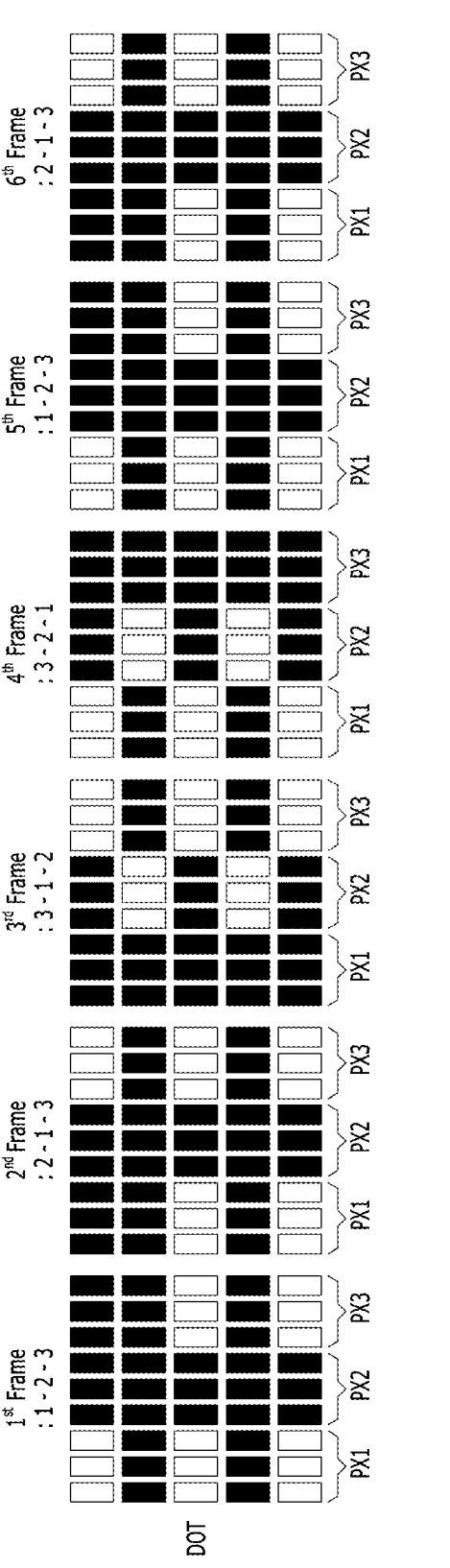

FIGS. 19 to 21 are diagrams showing evaluation results when three types of inversion methods were performed over a total six frames based on the second embodiment.

V1B in FIG. 19 shows the evaluation result of performing an inversion method that emits and does not emit light by operating data lines one by one in the vertical direction, H1B in FIG. 20 shows the evaluation result of performing an inversion method that emits and does not emit light by operating gate lines one by one in the horizontal direction, and DOT in FIG. 21 shows the evaluation result of performing an inversion method that emits and does not emit light by operating data lines one by one in the vertical direction and gate lines one by one in the horizontal direction. In FIGS. 19 to 21, 1-2-3, 2-1-3, 3-1-2, 3-2-1, and the like indicate that the driving order of three gate lines arranged on one horizontal line was changed per frame.

As shown in FIGS. 19 to 21, by way of example, in the display panel implemented according to the second embodiment, the position of the pixel where weak charging occurs are changed (alternated) per frame. The display panel implemented according to the second embodiment compensates for weak charging, because the position of the pixel where weak charging occurs is changed (alternated) per frame and thus appears as an average luminance throughout the entire display panel.

As described above, by way of example, the present disclosure has the effects of not only preventing twisting between respective wirings and short-circuit between the respective wiring when implementing a display panel based on two non-inverted subpixels and one inverted subpixel, but also maximizing an aperture ratio through the straight-line arrangement of data lines and gate lines. Further, the first embodiment of the present disclosure defines and changes the charging order of the subpixels with a data voltage based on two non-inverted subpixels and one inverted subpixel, thereby being capable of minimizing increase in RC delay of the data lines while enabling column inversion when implementing a display panel. Further, the present disclosure has the effects of minimizing the possibility of occurrence of short-circuit due to increase in the number of connection lines (connection electrodes) and providing a structure which is easy to repair.

As is apparent from the above description, by way of example, a display device according to the present disclosure has the effects of not only preventing twisting between respective wirings and short-circuit between the respective wiring when implementing a display panel based on two non-inverted subpixels and one inverted subpixel, but also maximizing an aperture ratio through the straight-line arrangement of data lines and gate lines. Further, the display device according to the first embodiment of the present disclosure defines and changes the charging order of the subpixels with a data voltage based on two non-inverted subpixels and one inverted subpixel, thereby being capable of minimizing increase in RC delay of the data lines while enabling column inversion when implementing a display panel. Further, the display device according to the present disclosure provides a structure which minimizes the possibility of occurrence of short-circuit due to increase in the number of connection lines (connection electrodes) and is easy to repair.

It will be apparent to those skilled in the art that various modifications and variations can be made in the present disclosure without departing from the spirit or scope of the disclosure. Thus, it is intended that the present disclosure cover the modifications and variations of the present disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a first pixel including three subpixels respectively connected to a first data line, a second data line, and a third data line that are arranged in a first direction and connected to a first gate line arranged in a second direction;
a second pixel including three subpixels respectively connected to the first data line, the second data line, and the third data line and connected to a second gate line spaced apart from the first gate line in the second direction;
a third pixel including three subpixels respectively connected to the first data line, the second data line, and the third data line and connected to a third gate line spaced apart from the second gate line in the second direction; and
a fourth pixel including three subpixels respectively connected to the first data line, the second data line, and the third data line and connected to a fourth gate line spaced apart from the third gate line in the second direction,
wherein emission areas and circuit areas included in the first pixel and the fourth pixel are inverted compared to emission areas and circuit areas included in the second pixel and the third pixel.

2. The display device according to claim 1, wherein at least one of the first data line, the second data line, or the third gate line traverses the emission areas.

3. The display device according to claim 1, wherein each of the first data line, the second data line, and the third data line includes a plurality of data connection lines arranged in the second direction that provides electrical connection to the three subpixels included in each of the first pixel, the second pixel, and the third pixel, wherein the data connection lines traverse the emission areas.

4. The display device according to claim 3, wherein:
the first data line, the second data line, and the third data line are formed based on a lower metal layer located as a lowermost layer on a substrate; and
the data connection lines are formed based on a semiconductor layer located above the lower metal layer.

5. The display device according to claim 1, wherein each of the first data line, the second data line, and the third data line includes:
two data lines spaced apart from each other; and
a connection electrode that electrically connects the two data lines.

6. The display device according to claim 1, further comprising:
a first reference line, a second reference line, and a third reference line arranged in the first direction and respectively connected to the first pixel, the second pixel, and the third pixel,
wherein:
each of the first reference line, the second reference line, and the third reference line includes a plurality of reference connection lines arranged in the second direction that provides electrical connection to the first pixel, the second pixel, and the third pixel; and
the reference connection lines traverse the emission areas.

7. The display device according to claim 6, wherein:
the first data line, the second data line, and the third data line are formed based on a lower metal layer located as a lowermost layer on a substrate; and
the reference connection lines are formed based on a semiconductor layer located above the lower metal layer.

8. A display device comprising:
a display panel including a plurality of pixels, each of the pixels including a red subpixel, a green subpixel, and a blue subpixel; and
a driver that, in operation, drives the display panel,
wherein:
a plurality of red data connection lines and a plurality of blue data connection lines that respectively connect the red subpixels and the blue subpixels to a red data line and a blue data line are completely symmetrical to each other horizontally and vertically; and
a plurality of green data connection lines that connect the green subpixels to a green data line are pseudo-symmetrical horizontally and vertically with respect to the green data line.

9. The display device according to claim 8, wherein the display panel includes:
a plurality of gate lines respectively connected to the pixels;
a plurality of data connection lines that connect the pixels to the red data line, the blue data line, and the green data line; and
a plurality of reference connection lines that connect the pixels to a plurality of reference lines, and
wherein at least one of the gate lines, at least one of the data connection lines, and at least one of the reference connection lines traverse emission areas of the pixels.

10. The display device according to claim 9, wherein:

the pixels include a first pixel arranged adjacent to a first data line, a second pixel arranged adjacent to a second data line, and a third pixel arranged adjacent to a third data line; and the pixels are charged with a data voltage output from the driver in an order of the third pixel, the first pixel, and the second pixel.

11. A method of manufacturing a display device, the method comprising:

connecting three subpixels included in a first pixel to a first data line, a second data line, and a third data line, respectively, wherein the first data line, the second data line, and the third data line are arranged in a first direction;

connecting the three subpixels included in the first pixel to a first gate line arranged in a second direction;

connecting three subpixels included in a second pixel to the first data line, the second data line, and the third data line, respectively;

connecting the three subpixels included in the second pixel to a second gate line spaced apart from the first gate line in the second direction;

connecting three subpixels included in a third pixel to the first data line, the second data line, and the third data line, respectively;

connecting the three subpixels included in the third pixel to a third gate line spaced apart from the second gate line in the second direction;

connecting three subpixels included in a fourth pixel to the first data line, the second data line, and the third data line, respectively; and connecting the three subpixels included in the fourth pixel to a fourth gate line spaced apart from the third gate line in the second direction, wherein emission areas and circuit areas included in the first pixel and the fourth pixel are inverted compared to emission areas and circuit areas included in the second pixel and the third pixel.

12. The method according to claim 11, wherein at least one of the first data line, the second data line, or the third gate line traverses the emission areas.

13. The method according to claim 11, wherein each of the first data line, the second data line, and the third data line includes a plurality of data connection lines arranged in the second direction that provides electrical connection to the three subpixels included in each of the first pixel, the second pixel, and the third pixel, wherein the data connection lines traverse the emission areas.

14. The method according to claim 13, further comprising:

forming the first data line, the second data line, and the third data line based on a lower metal layer located as a lowermost layer on a substrate; and forming the data connection lines based on a semiconductor layer located above the lower metal layer.

15. The method according to claim 11, wherein each of the first data line, the second data line, and the third data line includes:

two data lines spaced apart from each other; and a connection electrode that electrically connects the two data lines.

16. The method according to claim 11, further comprising:

connecting a first reference line, a second reference line, and a third reference line arranged in the first direction to the first pixel, the second pixel, and the third pixel, respectively, wherein:

each of the first reference line, the second reference line, and the third reference line includes a plurality of reference connection lines arranged in the second direction that provides electrical connection to the first pixel, the second pixel, and the third pixel; and the reference connection lines traverse the emission areas.

17. The according to claim 16, further comprising:

forming the first data line, the second data line, and the third data line based on a lower metal layer located as a lowermost layer on a substrate; and forming the reference connection lines based on a semiconductor layer located above the lower metal layer.

* * * * *